(12) United States Patent
Amano et al.

(10) Patent No.: US 11,546,528 B2
(45) Date of Patent: Jan. 3, 2023

(54) IMAGE PROCESSING METHOD

(71) Applicant: FUJI CORPORATION, Chiryu (JP)

(72) Inventors: Masafumi Amano, Okazaki (JP); Yuta Yokoi, Kariya (JP)

(73) Assignee: FUJI CORPORATION, Chiryu (JP)

( * ) Notice: Subject to any disclaimer, the term of this patent is extended or adjusted under 35 U.S.C. 154(b) by 23 days.

(21) Appl. No.: 17/258,321

(22) PCT Filed: Jul. 12, 2018

(86) PCT No.: PCT/JP2018/026262
§ 371 (c)(1),
(2) Date: Jan. 6, 2021

(87) PCT Pub. No.: WO2020/012588
PCT Pub. Date: Jan. 16, 2020

(65) Prior Publication Data
US 2021/0274104 A1    Sep. 2, 2021

(51) Int. Cl.
*H05K 3/30* (2006.01)
*H04N 5/262* (2006.01)
(Continued)

(52) U.S. Cl.
CPC ......... *H04N 5/2628* (2013.01); *H04N 5/2624* (2013.01); *H05K 13/0408* (2013.01);
(Continued)

(58) Field of Classification Search
CPC ......... Y10T 29/49826; Y10T 29/53178; Y10T 29/53191; Y10T 29/53174; Y10T 29/49131; Y10T 29/53091; Y10T 29/4913; Y10T 29/49133; H01L 2224/7565; H01L 21/681; H05K 13/0413
(Continued)

(56) References Cited

U.S. PATENT DOCUMENTS

| 8,390,724 B2 * | 3/2013 | Toyomura | H04N 5/349 348/340 |
| 9,980,420 B2 * | 5/2018 | Amano | G06T 3/4053 |
| 2018/0098468 A1 | 4/2018 | Takama | |

FOREIGN PATENT DOCUMENTS

| JP | 2004-361145 A | 12/2004 |
| JP | 2017-220544 A | 12/2017 |

OTHER PUBLICATIONS

International Search Report dated Oct. 2, 2018 in PCT/JP2018/026262 filed on Jul. 12, 2018.

* cited by examiner

*Primary Examiner* — Thiem D Phan
(74) *Attorney, Agent, or Firm* — Oblon, McClelland, Maier & Neustadt, L.L.P.

(57) ABSTRACT

Provided is an image processing method for easily viewing images obtained by imaging multiple components at a time, the method including image capturing processing of capturing each component holding state relating to multiple suction nozzles mounted on a mounting head as one image, image dividing processing of dividing a region relating to a predetermined component holding state for image data of the multiple component holding states obtained by the image capturing processing, direction conversion processing of converting a direction of the component holding state for divided image data divided by the image dividing processing, and display processing of displaying an image based on the divided image data subjected to the direction conversion processing.

6 Claims, 7 Drawing Sheets

(51) Int. Cl.
*H05K 13/04* (2006.01)
*H05K 13/08* (2006.01)

(52) U.S. Cl.
CPC ..... *H05K 13/0409* (2018.08); *H05K 13/0815* (2018.08); *Y10T 29/49131* (2015.01)

(58) Field of Classification Search
USPC ......... 29/833, 593, 739, 743, 759, 830, 832, 29/834
See application file for complete search history.

IMAGE PROCESSING METHOD

TECHNICAL FIELD

The present application relates to an image processing method, targeting multiple components picked up and held by multiple suction nozzles of a rotary head, and a component mounting machine for executing image processing.

BACKGROUND ART

In a component mounting machine, a mounting head having a suction nozzle is configured to move inside the machine, components supplied from a component supply device are picked up and held so that the components are mounted on a board conveyed by a conveyance device. In the component mounting machine of Patent Literature 1 below, a rotary head for pivoting multiple nozzles disposed in a circumferential direction as a mounting head is used. The rotary head includes a side camera for imaging a tip portion of the suction nozzle and an optical system for forming images of multiple locations by multiple mirrors at an imaging element. Therefore, in the first conventional example, by simultaneously capturing images of the multiple locations, an operator can check multiple statuses from a monitor at a time.

Patent Literature 2 below relates to a mounting production system for mounting components on a printed circuit board, an inspection method using an image for processing of each step is described. In this inspection method, for example, when the board is sent in an order of a printing step, a mounting step, and a reflow step, the board is imaged by a camera of an inspection device every time the board passes through each step, and thus a state inspection after each step becomes possible. At this time, a magnification and direction of verification image data may be differed, and a size and direction of an inspection image displayed on the monitor may become different. Therefore, in the second conventional example, the inspection images are aligned by enlarging or reducing processing of the verification image data, or by direction conversion processing.

PATENT LITERATURE

Patent Literature 1: JP-A-2017-220544
Patent Literature 2: JP-A-2004-361145

BRIEF SUMMARY

Technical Problem

In the component mounting machine of the first conventional example, images of multiple suction nozzles captured at the same time are displayed at a time. At this time, since an image is captured via multiple mirrors, the inverted image may be displayed on the monitor for some of the suction nozzles. In the component mounting machine, multiple components held in the rotary head are imaged at a time by a part camera, the status of each component is checked, and the images of each of the components in different orientations are displayed in the monitor. In a case where the same object in different direction is displayed on the monitor, the method of aligning the directions of the respective image data as in the second conventional example cannot handle the problem.

The present disclosure, in order to solve such problems, and an object thereof is to provide an image processing method and a component mounting machine for easily viewing an image obtained by imaging multiple components at a time.

Solution to Problem

An image processing method according to an aspect of the present disclosure includes: image capturing processing for capturing each component holding state as one image, the state of which being related to multiple suction nozzles mounted on a mounting head; image dividing processing for dividing a region relating to a predetermined component holding state, the region being derived from image data of the multiple component holding states obtained by the image capturing processing; direction conversion processing for converting a direction of the component holding state for divided image data divided by the image dividing processing; and display processing for displaying an image based on the divided image data subjected to the direction conversion processing.

A component mounting machine according to another aspect of the present disclosure includes a board conveyance device configured to convey a board into the machine, a component supply device configured to supply a component to be mounted on the board, a component mounting device configured to move a mounting head having multiple suction nozzles inside the machine to mount the component on the board by the suction nozzle, an image capturing device configured to capture each component holding state relating to the multiple suction nozzles mounted on the mounting head as one image, an image data processing device configured to divide image data obtained by the image capturing device for each component holding state image of the suction nozzles and create converted image data in which a direction of the component holding state is converted for each divided image data and a display device configured to display an image based on the converted image data created by the image data processing device.

Advantageous Effects

According to the above configuration, one image obtained by imaging the component holding state of each of the multiple suction nozzles is divided into a predetermined region for each component holding state of the suction nozzle, and by converting the direction for each of the divided image data, an easy-to-see image in which the directions of the components are aligned can be obtained.

DESCRIPTION OF EMBODIMENTS

Figure 1:
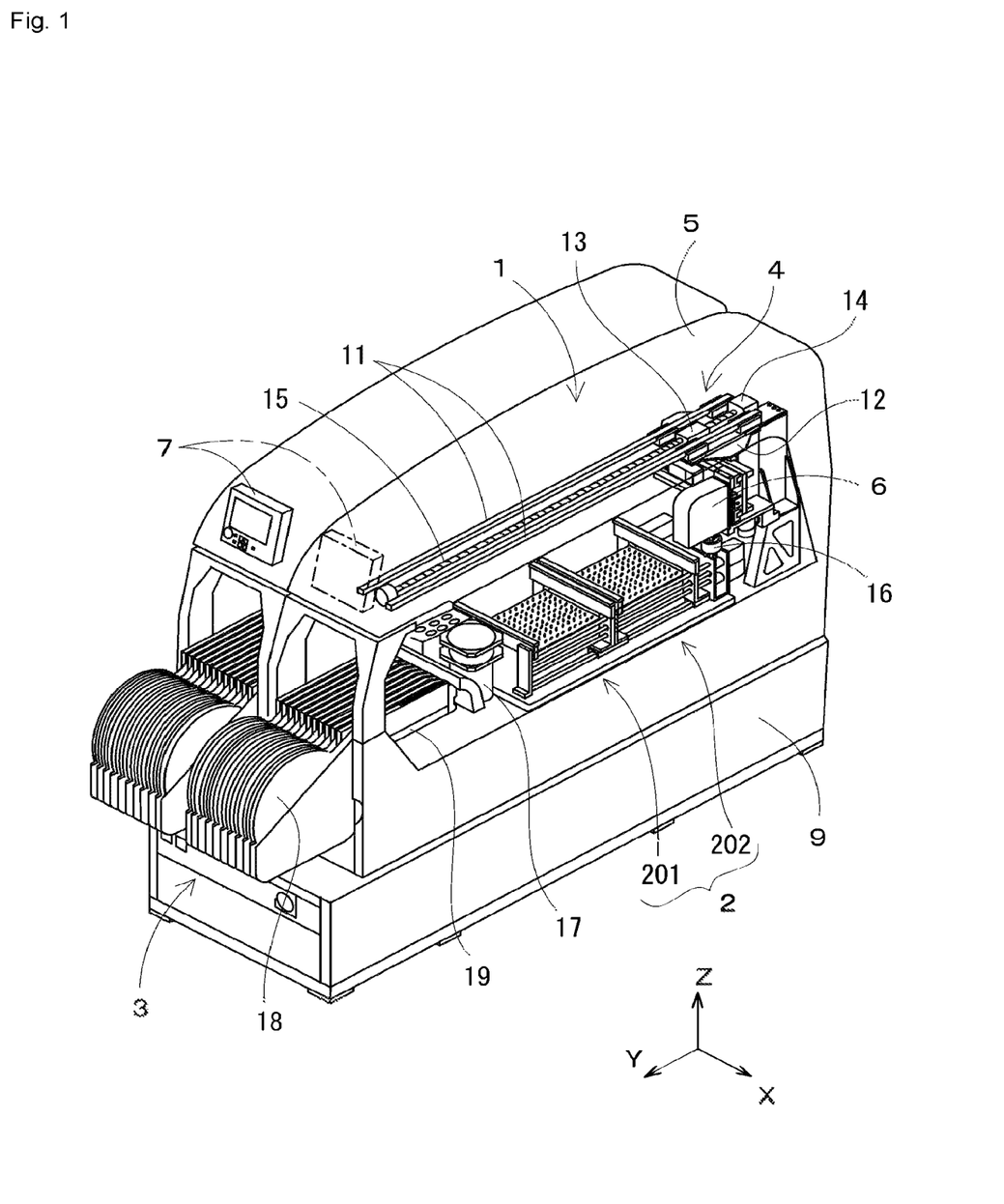
FIG. 1 is an appearance perspective view illustrating an embodiment of a component mounting machine.

An image processing method and a component mounting machine according to an embodiment of the present disclosure will be described below with reference to the drawings. FIG. 1 is an appearance perspective view of a component mounting machine shown in a partial perspective. Component mounting machine 1 of the present embodiment is a so-called mounter for mounting the component with respect to the conveyed board. Component mounting machine 1 is formed with a large opening on a side surface in a width direction, to allow conveyance of the board between the component mounting machine and an adjacent component mounting machine, and a board manufacturing line is configured by arranging with screen printing machine, other component mounting machine, and the like. A state in which two component mounting machines 1 are mounted side by side on base 9 is shown in FIG. 1. A machine width direction, which is a direction for conveying the board, will be described as an X-axis direction, a front-rear direction of the machine orthogonal thereto as a Y-axis direction, and a height direction as a Z-axis direction.

Component mounting machine 1 includes board conveyance device 2 for conveying the board, component supply device 3 for supplying components, and component mounting device 4 for mounting the components picked up from component supply device 3 on the board. In board conveyance device 2, the conveyance sections 201,202, which are belt conveyors having the same configuration in accordance with the size of the board, are arranged side by side, and conveyance of the board and component mounting work with respect to the board are performed at two places. Each of conveyance sections 201,202 is provided with a clamping mechanism so that it is possible to position the conveyed board in the machine.

Tape feeder 18 holding the component is mounted on component supply device 3. In component mounting machine 1, openings are formed in a front portion of main body cover 5, device table 19 is installed therein, and multiple tape feeders 18 are attached in a detachable state, respectively. Next, component mounting device 4 is a work device for picking up the component from tape feeder 18 and mounting the component on the board, and includes mounting head 6 having suction nozzle 21 (see FIG. 2) has a movable configuration on a horizontal XY-plane.

Two Y-axis rails 11 in the front-rear direction of the machine are fixed in parallel on a ceiling side of main body cover 5, and Y-axis slide 12 is slidably assembled with respect to Y-axis rails 11. Nut member 13 is fixed to Y-axis slide 12, and Y-axis slide 12 is configured with a ball screw mechanism in which screw shaft 15 coupled to Y-axis servo motor 14 is screwed through nut member 13. Further, an X-axis rail is fixed to Y-axis slide 12, and mounting head 6 mounted on a X-axis slide is slidably assembled in an X-axis direction. The X-axis slide is configured with a ball screw mechanism that converts a rotation of the X-axis servo motor into linear motion.

Part camera 17 is provided in a movement range of mounting head 6 moving in the machine. In the present embodiment, the part camera is provided between component supply device 3 for supplying the component and board conveyance device 2 for conveying and holding the board. Part camera 17 images, from below, the component held by mounting head 6, and can detect damage of the components and a holding position and orientation of the held components from the image data. Mounting head 6 is equipped with multiple suction nozzles 21, and part camera 17 is capable of imaging the entire components picked up and held therein at a time.

Figure 2:
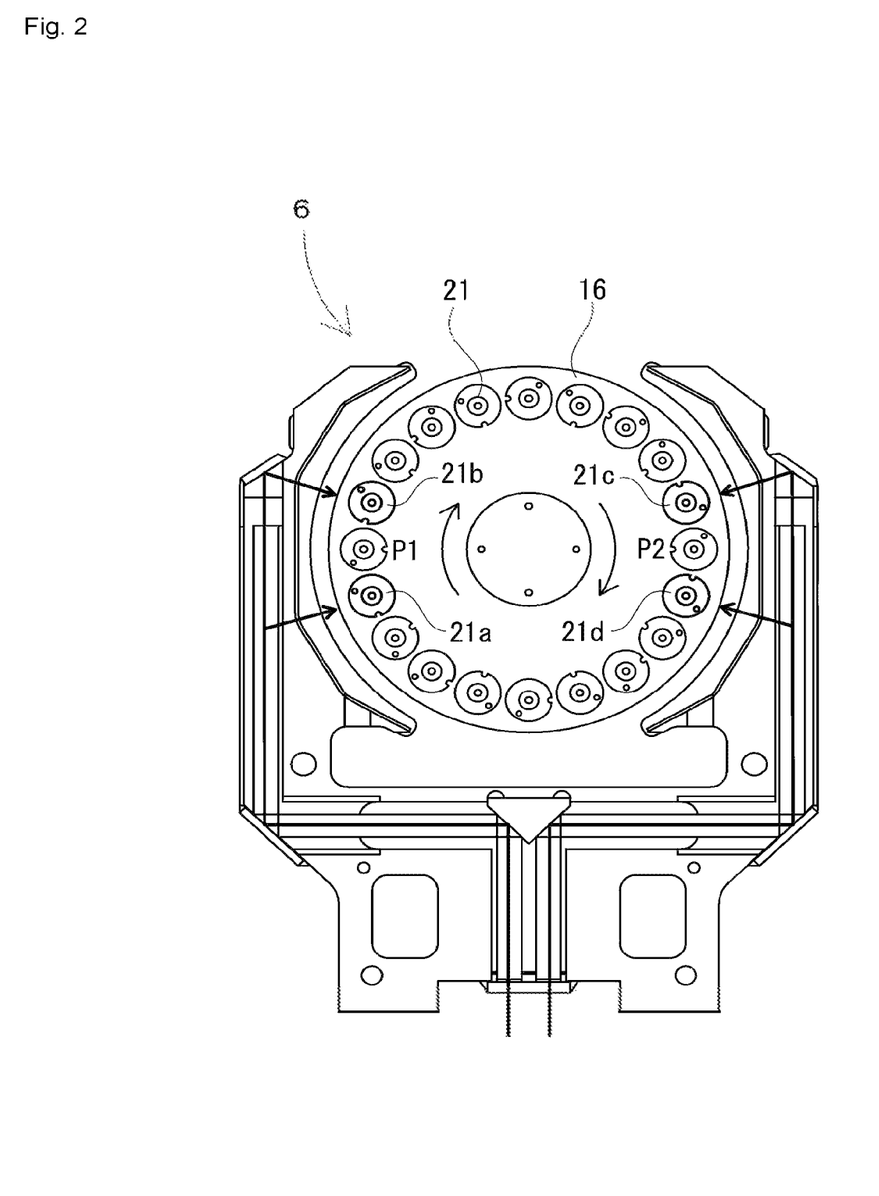
FIG. 2 is a diagram illustrated by simplifying a portion of a mounting head from a lower side in a rotation axis direction.
Figure 3:
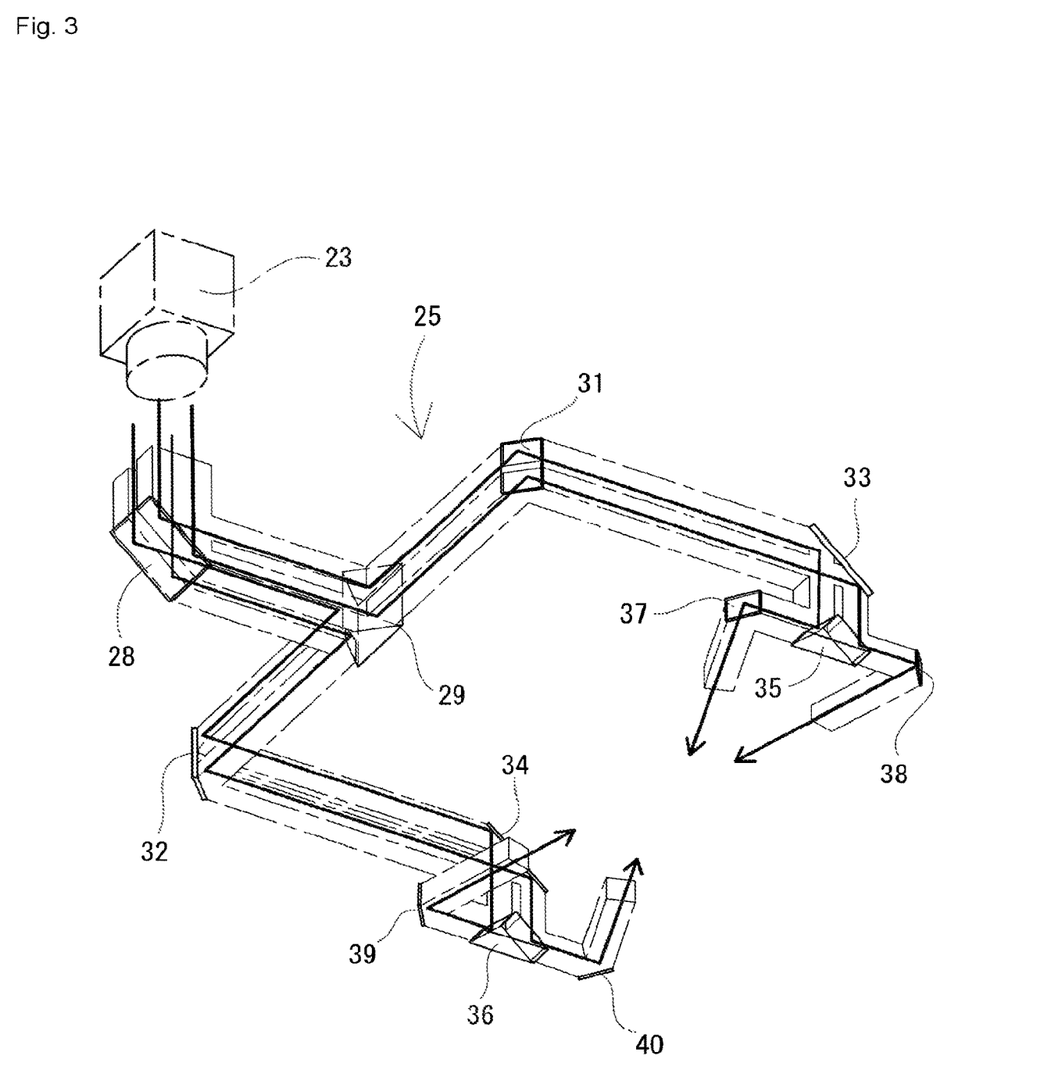
FIG. 3 is a diagram conceptually illustrating an optical system mounted on the mounting head.

FIG. 2 is a simplified diagram of a portion of mounting head 6 from a lower side of a rotation axis direction. Further, FIG. 3 is a diagram conceptually illustrating an optical system mounted on mounting head 6. Mounting head 6 has nozzle holder 16 which is coupled to a pivoting motor, and multiple suction nozzles 21 are attached at equal intervals in a circumferential direction thereof. Mounting head 6 arranges, by revolving indexing with rotation of nozzle holder 16, two suction nozzles 21 at P1 position and P2 position, which are component pickup positions, and mounting head 6 is configured to move up and down by a lifting and lowering mechanism for converting a rotation of lifting and lowering motor into a linear motion in a vertical direction.

In such mounting head 6, the component is picked up and held by vacuum pumping while a lifting and lowering operation of suction nozzle 21, and mounting of the component on the board is performed by positive pressure application. Component mounting machine 1 is provided with an image capturing device for checking a picking up and holding state of the component at a nozzle tip portion, a non-holding state after mounting (collectively referred to as "component holding state") and the like, with respect to suction nozzle 21 that performs the operation. One of them is part camera 17 described above, which images multiple components picked up and held by mounting head 6 passing above.

In addition, mounting head 6 is provided with an image capturing device which has side camera 23 for imaging the tip portion of the suction nozzle from a side, and optical system 25 for forming images of multiple locations at imaging element by multiple mirrors. Optical system 25 relating to side camera 23 of mounting head 6 is represented in FIGS. 2 and 3. In mounting head 6, each time nozzle holder 16 rotates at a constant angle, the revolving indexing is performed with suction nozzle 21 being arranged at the P1 position or P2 position in order. In side camera 23, two suction nozzles 21 (21a, 21b, 21c, and 21d) each positioned before and after the P1 position and the P2 position are imaged.

That is, in the image capturing device, nozzle tip portions of suction nozzles 21a and 21c immediately before picking up and holding the component at the P1 position or the P2 position, and nozzle tip portions of suction nozzles 21b and 21d immediately after picking up and holding the component at the P1 position or the P2 position can be imaged at a time. Therefore, optical system 25, as shown by four lines, is configured such that the light reflected from suction nozzles 21 at four locations (21a, 21b, 21c, 21d) enters in a direction opposite to the direction indicated by the arrow, and the reflected light is received by the imaging element of side camera 23.

Optical system 25 changes a light path from an up-down direction to a lateral direction by plate-shaped mirror 28, and is divided into P1 side and P2 side by triangular prism block mirror 29, when viewed from side camera 23. On separated both sides, the direction is changed by reflecting on plate-shaped mirrors 31 and 32, and the next plate-shaped mirrors 33 and 34 in the same manner, and the light path is divided into two directions at the P1 side and the P2 side by triangular prism block mirrors 35 and 36, respectively. The light is reflected form plate mirrors 37, 38, 39, and 40, and reaches suction nozzles 21*a*, 21*b*, 21*c*, and 21*d*.

Figure 4:
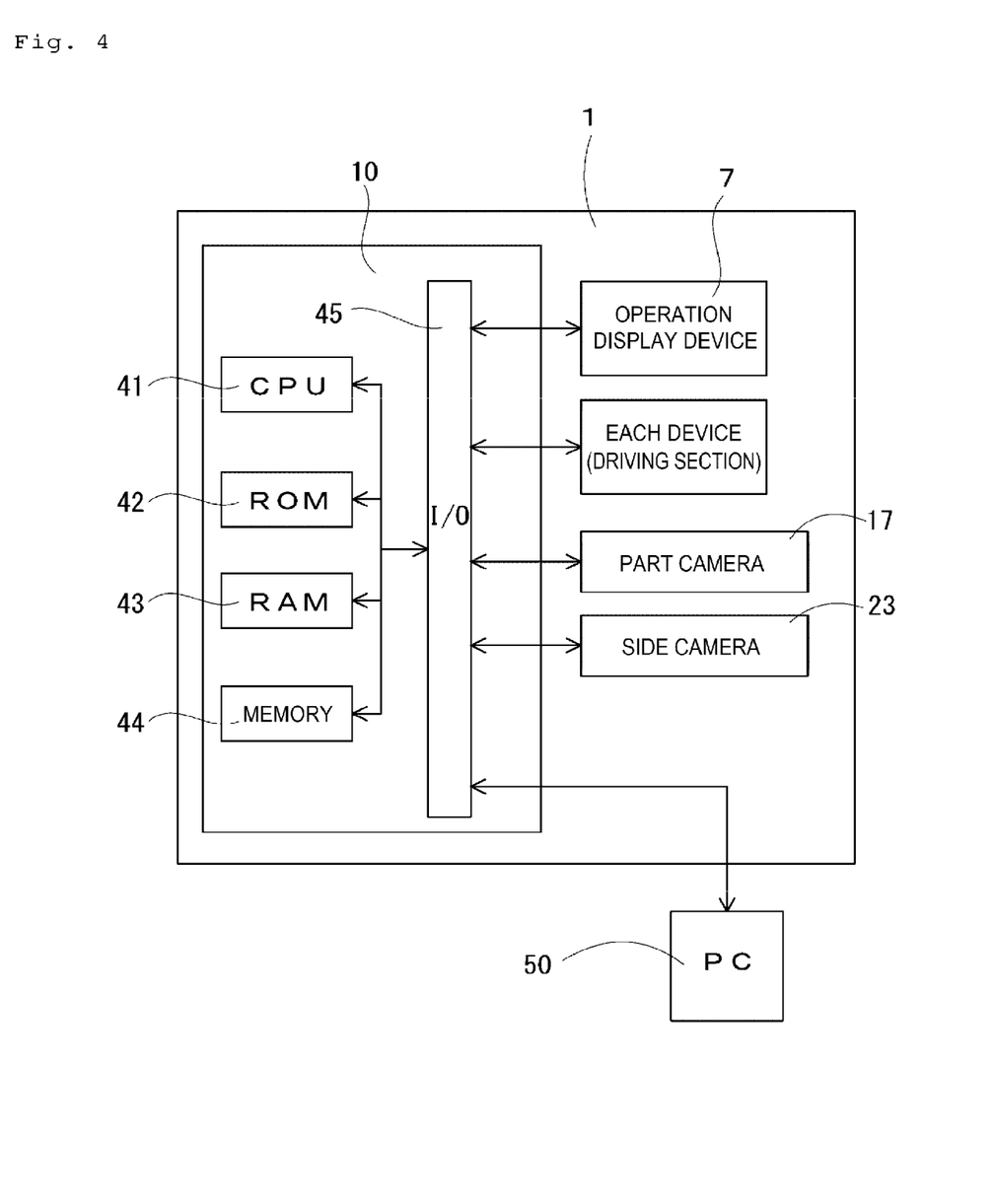
FIG. 4 is a block diagram simply illustrating a control system of the component mounting machine.

Next, FIG. 4 is a block diagram illustrating a control system of component mounting machine 1. In control device 10, a microprocessor (CPU) 41, ROM 42, RAM 43, and non-volatile memory 44 are connected via a bus line. CPU 41 controls the entire control device, ROM 42 stores system programs and control parameters executed by CPU 41, and RAM 43 stores temporary calculated data, image data, and the like. Non-volatile memory 44 stores information required for processing performed by CPU 41, and stores a sequence program or the like of component mounting machine 1.

In addition, non-volatile memory 44 stores a production job (production program) for performing a predetermined operation on the board by mounting head 6, an image processing program for displaying a component holding state relating to suction nozzle 21, and the like. Image processing program of the present embodiment processes the image data of the component holding state relating to suction nozzle 21 imaged by part camera 17 and side camera 23 by processing by a predetermined image processing method and displays the image on a monitor.

Component mounting machine 1 is provided with operation display device 7 having a touch panel type monitor or a button type input section at the front of the machine, and is connected to control device 10. General-purpose computer 50 having a monitor as a management device for managing the entire system of component mounting machine 1 is connected to control device 10. In addition to displaying the image processed by control device 10 on the monitor, computer 50 may also acquire image data of the component holding state relating to suction nozzle 21, and may store an image processing program for itself to perform image processing. Therefore, the display on the monitor described below corresponds to both operation display device 7 and computer 50.

Next, an operation of component mounting machine 1 will be described. In component mounting machine 1, by the drive control in accordance with the program, mounting head 6 moves on the XY-plane, picking up and holding of the components supplied from component supply device 3 by suction nozzle 21 is performed. At that time, in mounting head 6, by the revolving indexing for which nozzle holder 16 is rotated, multiple suction nozzles 21 are moved to the P1 position or P2 position in order, vacuum pumping is performed as suction nozzle 21 at each position descends, and the component fed by tape feeder 18 is picked up and held. Mounting head 6 is mounted with 20 suction nozzles 21 as shown in FIG. 2, and picking up and holding of the component is performed by all of suction nozzles 21.

Thereafter, mounting head 6 is moved from component supply device 3 to board conveyance device 2, mounting of the component is performed with respect to the conveyed board. In such a series of operations, during the picking up of the component performed by component supply device 3, a component holding state relating to suction nozzle 21 is imaged by side camera 23. Then, in the middle of moving to board conveyance device 2 for mounting the component from component supply device 3, a component holding state relating to suction nozzle 21 is imaged by part camera 17.

Figure 5:
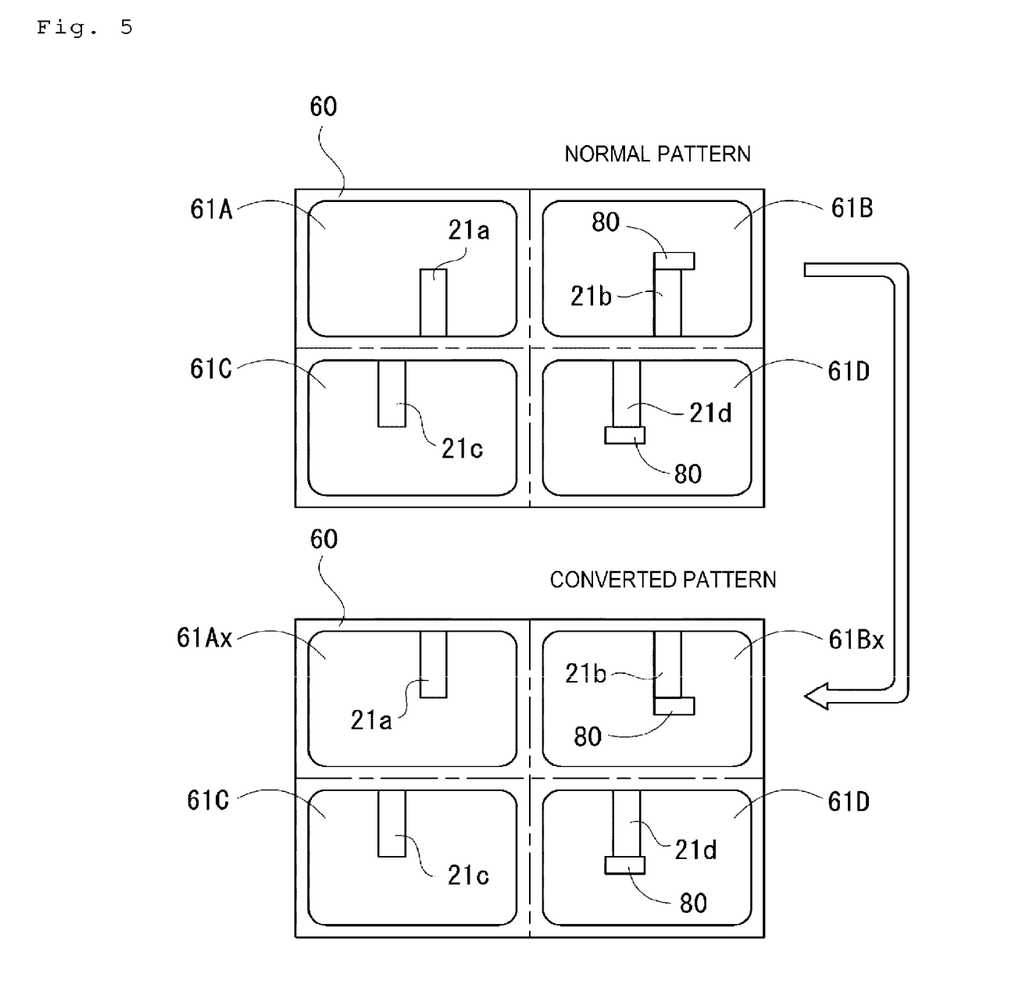
FIG. 5 is a diagram illustrating a display screen of a component holding state of a suction nozzle imaged by a side camera.

In the image processing program, when a check mode from operation display device 7 and computer 50 is selected by the operator, the images of the component holding states captured by side camera 23 and part camera 17 are displayed on the monitor. The reason is that the image may be displayed in a normal production process, but it is generally used for testing when a production program is created, for inspecting an initial product at the start of production, and the like. First, image processing of the image captured by side camera 23 will be described. FIG. 5 is a diagram illustrating a display screen of a component holding state of suction nozzle 21 imaged by side camera 23.

In mounting head 6, components 80 are picked up and held in order by suction nozzles 21 at the P1 position and the P2 position. In accordance with the suction operation, two suction nozzles 21*a* and 21*b* and two suction nozzles 21*c* and 21*d* positioned in front and rear are imaged by side camera 23. In side camera 23, the images of tip portions of four suction nozzles 21, which are subjects, that is, the images of component holding states are captured as one image by optical system 25 shown in FIG. 3, and are simultaneously displayed on one monitor 60 as shown in FIG. 5. Particularly in the present embodiment, the image processing is performed for the normal pattern on the upper side of FIG. 5 by the image processing program, and the image of the conversion pattern on the lower side of the FIG. 5 is displayed on monitor 60.

In optical system 25 of side camera 23, the image is inverted by a reflecting mirror. For this reason, for example, even if the image on the P1 side is vertically inverted as in the normal pattern image, the image has been displayed on monitor 60 as it is until now. However, the operator, who sees the image of the normal pattern, checks the image while guessing the original state of suction nozzle 21 from vertically inverted images 61A and 61B, there is a possibility that leads to misviewing or checking mistakes. Therefore, in the image processing program of the present embodiment, direction conversion processing of converting the direction of the component holding state in the original direction of nozzle assumed by the operator is performed.

First, among the image data captured by side camera 23, a region where the direction conversion is required is divided, and the image in which the top and bottom shown in the converted pattern image are inverted is created by the conversion of pixel values. In the case of side camera 23, regions of images 61A and 61B are targets of the conversion, and the inversion of the images for 180 degrees is also known in advance. Based on the image data captured by side camera 23, images 61Ax and 61Bx in which the tops and bottoms shown in the converted pattern image are inverted are created by the conversion of pixel values where the regions of images 61A and 61B are divided. Converted images 61Ax and 61Bx are replaced with images 61A and 61B, and are displayed on monitor 60 together with images 61C and 61D as one converted pattern image.

In this converted pattern image, since the tips of suction nozzles 21*a*, 21*b*, 21*c*, and 21*d* are all unified downward, the operator can intuitively understand respective suction component holding states. In the converted pattern image displayed on monitor 60, in addition to displaying the component holding states of suction nozzles 21*a*, 21*b*, 21*c*, and 21*d* on monitor 60 as one image as shown in FIG. 5, images 61C and 61D which are regions where the direction conversion are not required, may also be divided, and images 61Ax, 61Bx, 61C, and 61D of the component holding states of respective suction nozzles 21 may be displayed one by one on monitor 60.

Figure 6:
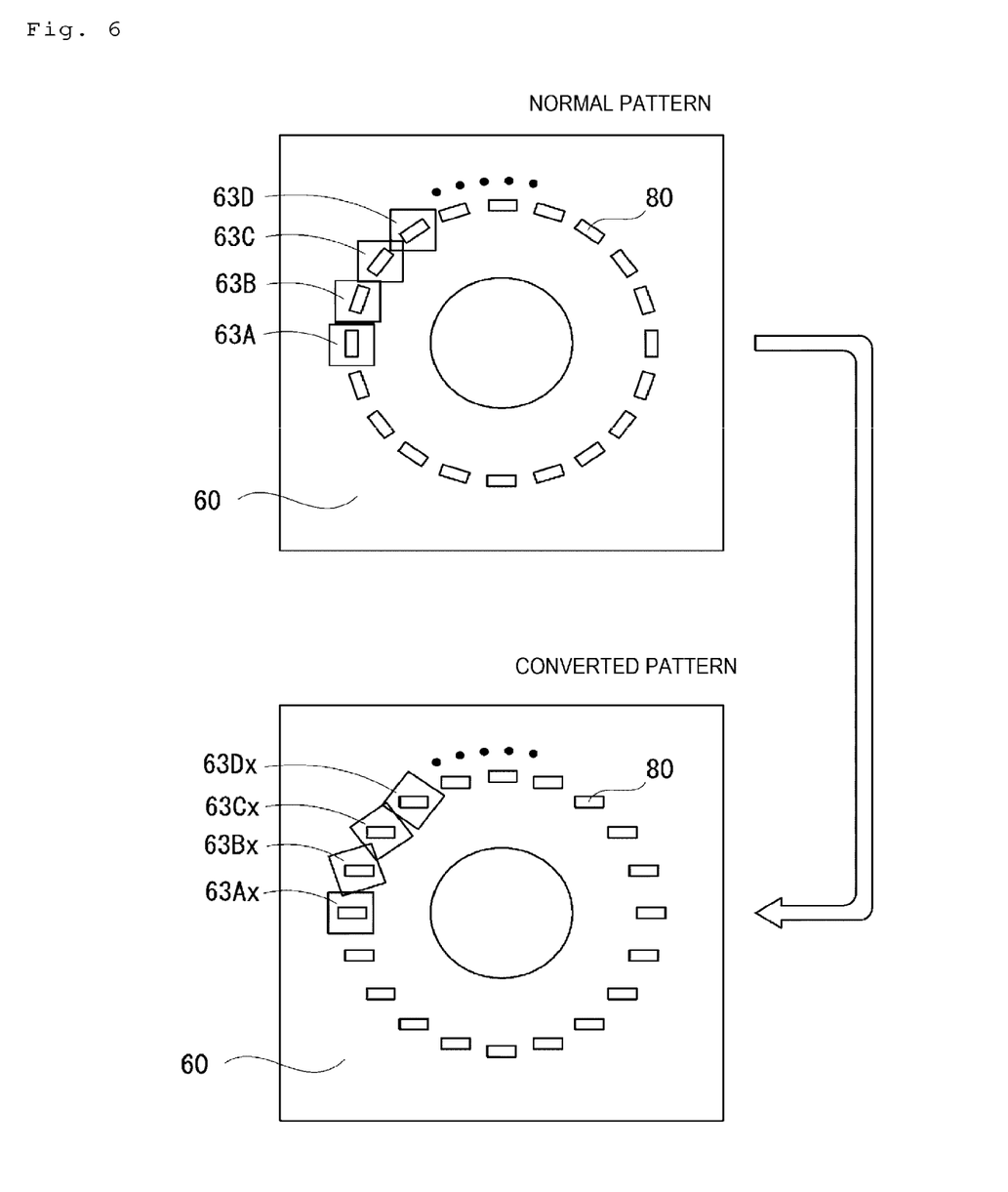
FIG. 6 is a diagram illustrating a display screen of the component holding state of the suction nozzle imaged by a part camera.
Figure 7:
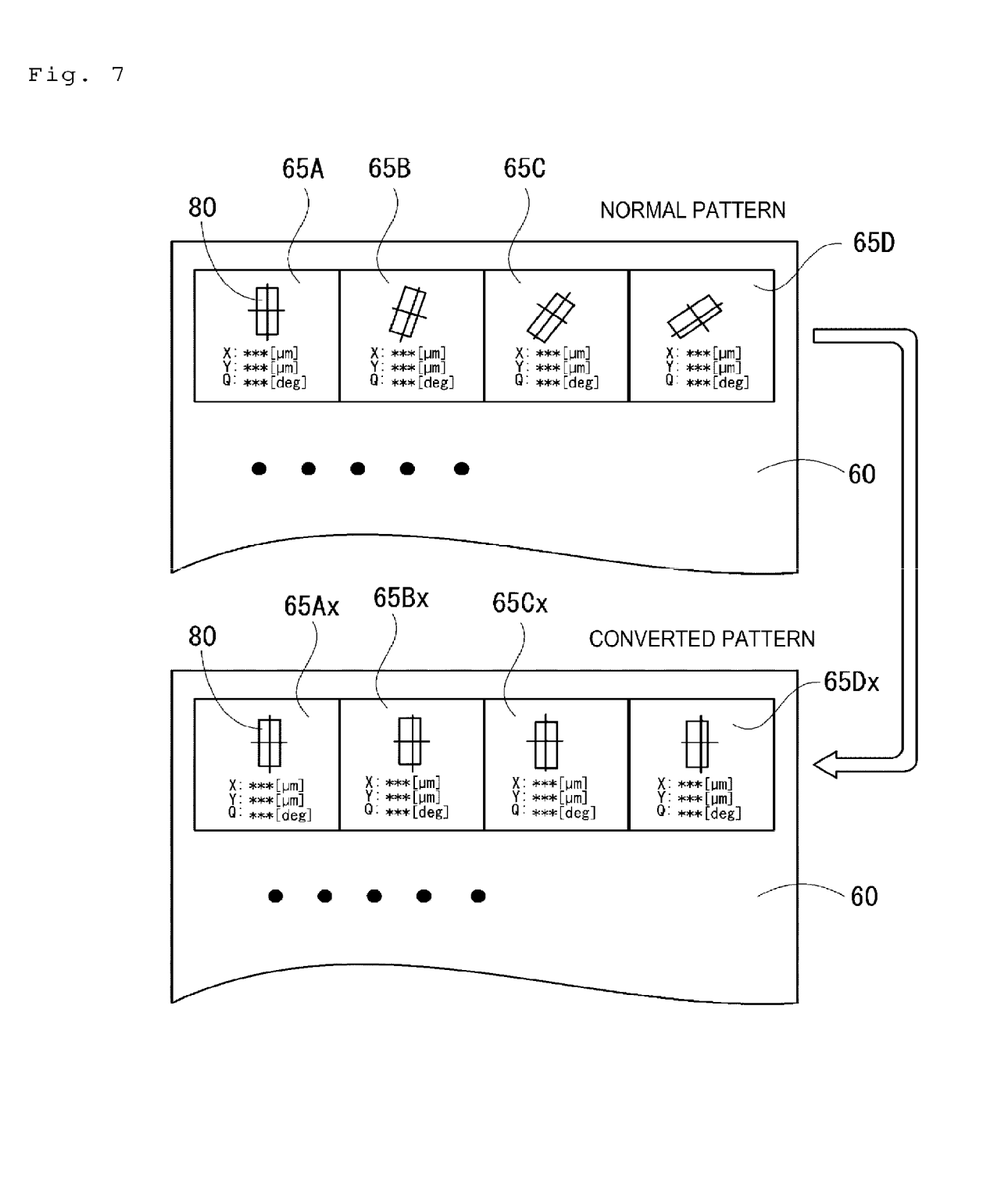
FIG. 7 is a diagram illustrating an image obtained by dividing the component holding states of the suction nozzles imaged by the part camera for each component.

Next, image processing of the image captured by part camera 17 will be described. FIG. 6 is a diagram illustrating a display screen of the component holding state of suction nozzle 21 imaged by part camera 17, in particular, illustrating a state of component 80 displayed on monitor 60. Further, FIG. 7 is a diagram illustrating an image obtained by dividing the component holding states of suction nozzles 21 imaged by part camera 17 for each component 80.

Mounting head 6 which picks up and holds component 80 passes over part camera 17 before mounting the component on the board. At this time, component 80 held by suction nozzle 21 is imaged, and component determination and positional deviation determination are performed based on the image data. Multiple components 80 imaged by part camera 17 are displayed on monitor 60 as shown in FIG. 6. However, in mounting head 6 which is a rotary head, since suction nozzle 21 revolves, as shown in the normal pattern of FIG. 6, directions of components 80 have become uneven. Therefore, in the image processing program of the present embodiment, the direction conversion processing is performed to align the directions of all components 80.

Among the image data captured by part camera 17, a region where the direction conversion is required is divided, all components 80 are horizontally converted by the conversion of pixel values, and the image shown in the conversion pattern is created. When the component is imaged by part camera 17, the position of component 80 in the image can be identified from center position information about each suction nozzle 21, and the direction of picked up and held component 80 from revolving angle information about each suction nozzle 21 (angle) can also be identified. Based on the image data captured by part camera 17, division of regions of images 63A, 63B, 63C, and 63D shown on the screen of the normal pattern in FIG. 6 is performed for all components 80.

Divided image 63A and the like are rotated by a predetermined angle so that all components 80 are oriented horizontally with respect to the screen by the conversion of pixel values, and a converted pattern image in which converted images 63Ax, 63Bx, 63Cx, and 63Dx are combined is generated, and the image of the component holding states in which multiple components 80 are arranged circumferentially is displayed on monitor 60 in the same manner as before the conversion. Thus, in the converted pattern image shown in FIG. 6, components 80 in different directions for each suction nozzle 21 are all unified in the same horizontal orientation, and the operator can intuitively understand the respective suction component holding states.

Further, the image data captured by part camera 17, as another display form, may be displayed together with the positional deviation information as shown in FIG. 7. Until now, as shown as a normal pattern, the image in the captured state has been displayed by dividing for each region of suction nozzle 21. However, since the directions of components 80 becomes uneven by revolving suction nozzles 21, it is difficult to understand the numerical value of deviation amount corresponding to the image of component 80.

With reference to a center of suction nozzle 21, how much the center position of the picked up and held component 80 has an error in the X-axis direction, the Y-axis direction, and the rotation direction of component mounting machine 1 shown in FIG. 1 is calculated, and the numerical value is displayed. However, in a case where the displayed images of components 80 are displayed in various directions, it is difficult for the operator to match and understand the deviation amount in the direction indicated by the numerical value and the image of component 80 displayed on monitor 60.

Therefore, in the image processing program of the present embodiment, the direction conversion processing is performed to align the directions of all components 80. First, in the normal pattern shown in FIG. 7, images 65A, 65B, 65C, 65D, . . . are divided for each region of all components 80 based on the information of each suction nozzle 21, as in the case of FIG. 6. Images 65Ax, 65Bx, 65Cx, 65Dx, . . . which are rotated at a predetermined angle for each divided image are created so that components 80 is vertically oriented by the conversion of the pixel values. Images 65Ax, 65Bx, 65Cx, 65Dx, . . . which are subjected to image processing are displayed on monitor 60 as a converted pattern image arranged in order.

Therefore, in the converted pattern image shown in FIG. 7, since components 80 which have been in the different directions for each suction nozzle 21 are displayed as an image of which all the longitudinal directions are unified in the Y-axis direction, the operator can intuitively understand the deviation amount in the Y-axis and X-axis directions and the deviation amount in the rotation direction. In particular, the direction conversion is vertically performed in accordance with the direction in which component 80 is mounted, that is, the Y-axis direction which is a front-rear direction of component mounting machine 1. Therefore, the operator can easily imagine the deviation amount when component 80 is mounted on the board.

In the above embodiment, components 80 are all represented as being the same, but the components handled by mounting head 6 are not limited to the same type and different types of components 80 may be included in one image. In FIGS. 6 and 7, respectively in the converted pattern image, the longitudinal directions of all components 80 are displayed by being unified in the X-axis direction or Y-axis direction, but the operator may operate operation display device 7 and computer 50 by instructing the control device to select a method for unifying the directions of components 80. For example, the directions are displayed in a direction that is used as a reference when creating component shape data for determining positional deviation of center and deviation of a revolving angle for various components 80. In this case, in one converted pattern image, longitudinal directions unified in the X-axis direction and longitudinal directions unified in the Y-axis direction may be included depending on the type of component 80. In addition, the directions may be displayed by directions of various components 80 supplied in component supply device 3.

The case where the converted pattern image which is subjected to the image processing is displayed on each monitor 60 without distinguishing between operation display device 7 and computer 50 has been described, but the image may be mainly displayed on computer 50. At this time, the divided image data such as the normal patterns imaged by side cameras 23 shown in FIG. 5 is stored in RAM 43 of control device 10 and transmitted to computer 50. In computer 50, an image of the conversion pattern is created based on the image data of the normal pattern as described above, and the image is displayed on monitor 60. In this case, in viewing the image of the conversion pattern on operation display device 7 of component mounting machine 1, the image of the conversion pattern created by computer 50 may be transmitted to control device 10 and displayed.

While an embodiment of the present disclosure has been described above, the present disclosure is not limited thereto, and various changes can be made without departing from the spirit thereof. For example, in the example of FIG. 6, the regions of images 63A, 63B, 63C, 63D, . . . are divided for all of components 80, it is not necessary to divide the image for the region of component 80 which is already displayed in horizontal orientation. The same applies to the example of FIG. 7. For example, in the above embodiment, the rotary head has been described as an example of mounting head 6 on which multiple suction nozzles 21 are mounted, but another type of mounting head may be used, or an imaging device including side camera 23 and optical system 25 provided on mounting head 6 may also have different configurations.

REFERENCE SIGNS LIST

1 . . . component mounting machine, 2 . . . board conveyance device, 3 . . . component supply device, 4 . . . component mounting device, 6 . . . mounting head, 7 . . . operation display device, 10 . . . control device, 16 . . . nozzle holder, 17 . . . part camera, 21(21*a*, 21*b*, 21*c*, 21*d*) . . . suction nozzle, 23 . . . side camera, 25 . . . optical system, 50 . . . computer, 60 . . . monitor

The invention claimed is:

1. An image processing method comprising:
    image capturing processing for capturing multiple component holding states as one image, the component holding states being related to multiple suction nozzles mounted on a mounting head;
    image dividing processing for dividing a region relating to each of the component holding states, the region being derived from image data of the multiple component holding states obtained by the image capturing processing;
    direction conversion processing for converting a direction of the component holding states for divided image data divided by the image dividing processing; and
    display processing for displaying a converted image based on the divided image data subjected to the direction conversion processing, the converted image displaying converted component holding states in which an orientation of the converted component holding states is unified by the direction conversion processing.

2. The image processing method according to claim 1, wherein in the display processing, multiple divided images of the component holding states of which directions are converted by the direction conversion processing are replaced, and images of the multiple component holding states obtained by the image capturing processing are displayed as the converted image.

3. The image processing method according to claim 1, further comprising:
    divided data storing processing for storing divided image data divided for each component holding state image of the suction nozzles by the image dividing processing,
    wherein in the direction conversion processing, a conversion is performed for multiple divided image data stored by the divided data storing processing.

4. The image processing method according to claim 1,
    wherein the component holding states are obtained by capturing components picked up and held by the multiple suction nozzles from an opposite side of a holding surface, and
    in the direction conversion processing, directions of the components are matched by a direction conversion of the divided image data.

5. The image processing method according to claim 4,
    wherein in the display processing, the divided image data of which directions have converted by the direction conversion processing is rearranged in vertical and horizontal directions and displayed as the converted image.

6. An image processing method comprising:
    image capturing processing for capturing each component holding state as one image, the state of which being related to multiple suction nozzles mounted on a mounting head;
    image dividing processing for dividing a region relating to a predetermined component holding state, the region being derived from image data of the multiple component holding states obtained by the image capturing processing;
    direction conversion processing for converting a direction of the component holding state for divided image data divided by the image dividing processing; and
    display processing for displaying an image based on the divided image data subjected to the direction conversion processing,
    wherein the component holding states are obtained by capturing tip portions of the multiple suction nozzles from a side surface side, and
    in the direction conversion processing, directions of the suction nozzles are matched by a direction conversion of divided image data.

\* \* \* \* \*